United States Patent [19]
Yamazaki

[11] Patent Number: 6,028,325
[45] Date of Patent: *Feb. 22, 2000

[54] SEMICONDUCTOR DEVICE CONTACT REGISTRATION STRUCTURE

[75] Inventor: Shunpei Yamazaki, Tokyo, Japan

[73] Assignee: Semiconductor Energy Laboratory Co., Ltd., Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/762,617

[22] Filed: Dec. 9, 1996

[30] Foreign Application Priority Data

Dec. 9, 1995 [JP] Japan .................................. 7-345633

[51] Int. Cl.[7] ......................... H01L 29/786; H01L 29/41
[52] U.S. Cl. ............................................ 257/66; 257/774
[58] Field of Search ............................. 257/49, 66, 410, 257/774

[56] References Cited

U.S. PATENT DOCUMENTS 5,289,030  2/1994  Yamazaki et al. .................... 257/410

*Primary Examiner*—John Guay
*Attorney, Agent, or Firm*—Fish & Richardson P.C.

[57] ABSTRACT

An aluminum pattern is formed at the same time as a gate electrode, and anodic oxide films are formed on the surfaces of the aluminum pattern and the gate electrode. After an interlayer insulating film is formed, a contact hole is formed through it. Even if the contact hole is deviated from the intended position, there occurs no failure because of the existence of the aluminum pattern on which the anodic oxide film is formed.

8 Claims, 9 Drawing Sheets

SEMICONDUCTOR DEVICE CONTACT REGISTRATION STRUCTURE

BACKGROUND OF THE INVENTION

1. Field of the Invention

The present invention relates to the configuration of a contact portion of a semiconductor device typified by a thin-film transistor as well as to a method of forming it.

2. Description of the Related Art

FIGS. 2A to 2E schematically show a conventional, old process used in a thin-film transistor manufacturing process, for instance. Specifically, this process is to take contact to a semiconductor layer formed on a glass substrate or a quartz substrate.

First, as shown in FIG. 2A, a semiconductor layer 202 is formed on a substrate 201 having an insulative surface. The substrate 201 is a quartz or glass substrate. The semiconductor layer 202 is an amorphous or crystalline silicon film. For example, the semiconductor layer 202 shown in FIG. 2A is part of an active layer of a thin-film transistor.

Next, an insulating film 203 is so formed as to cover the semiconductor layer 202. The insulating film 203, called an interlayer insulating film, is a silicon oxide film or a silicon nitride film. (FIG. 2B)

Then, an opening 204 called a contact hole is formed through the insulating film 203. (FIG. 2C)

Finally, a wiring line 205 is formed with such a material a metal or a silicide, to complete a contact portion (FIG. 2D)

However, as the semiconductor layer 202 pattern is miniaturized and is made finer, there may occur an erroneous positional relationship between the contact hole 204 and the semiconductor layer 202 as shown in FIG. 2E. This may result in etching of the substrate 201. Where a silicon oxide film as an undercoat film is formed on the substrate 201, it may be etched in a similar manner. This may later cause a contact failure, a line disconnection, and other failures.

The above erroneous positional relationship can be caused by a mask registration error in forming the contact hole 204, a mask registration error in forming the semiconductor layer 202 pattern, and other factors. In many cases, these factors occur in combination.

The state of FIG. 2E may be a cause of a failure in a manufacturing process. Although this problem can be solved by increasing the patterning accuracy and the accuracy of contact hole formation, these measures can cause other undesired effects such as an increase in manufacturing cost and reduction in productivity.

SUMMARY OF THE INVENTION

An object of the present invention is to solve the above-described registration error problem which occurs in forming a contact hole of a miniaturized semiconductor device.

According to a first aspect of the invention, there is provided a semiconductor device comprising a semiconductor; an insulating film formed on the semiconductor; a plurality of patterns formed on the insulating film and made of a material capable of being anodized, at least one of the plurality of patterns having a function of determining a position of a contact to the semiconductor; and anodic oxide films formed on respective surfaces of the plurality of patterns.

According to a second aspect of the invention, there is provided a semiconductor device comprising a semiconductor; an insulating film formed on the semiconductor; a plurality of patterns formed on the insulating film and made of a material capable of being anodized, at least one of the plurality of patterns serving as an electrode and at least one of the other patterns having a function of determining a position of a contact to the semiconductor; and anodic oxide films formed on respective surfaces of the plurality of patterns.

According to a third aspect of the invention, there is provided a manufacturing method of a semiconductor device comprising the steps of forming a first insulating film on a semiconductor; forming a thin film on the first insulating film with a material capable of being anodized; forming an electrode and a pattern for determining a position of a contact by patterning the thin film; forming anodic oxide films on respective surfaces of the electrode and the pattern; forming a second insulating film to cover the electrode and the pattern; and forming a contact hole through the first and second insulating films, and forming the contact to the semiconductor by utilizing the pattern.

DETAILED DESCRIPTION OF THE PREFERRED EMBODIMENTS

Embodiment 1

Figure 1A:
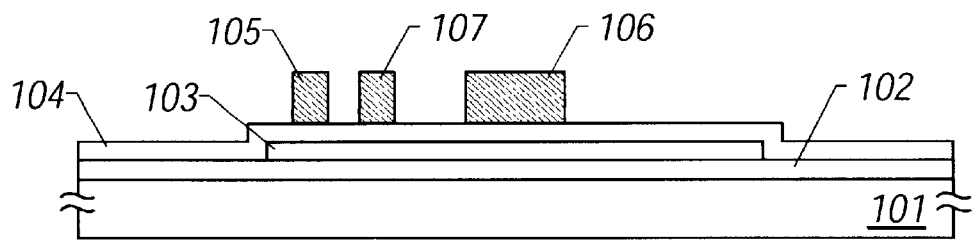
FIGS. 1A to 1D show a thin-film transistor manufacturing process according to a first embodiment of the present invention.

In this embodiment, the present invention is applied to a contact portion of a thin-film transistor.

FIGS. 1A to 1D show a manufacturing process according to this embodiment, i.e., a manufacturing process of a thin-film transistor that is disposed in the pixel region of an active matrix liquid crystal display device. In the pixel region, the source of the thin-film transistor is connected to one of source lines that are arranged in matrix and its drain is connected to one of pixel electrodes.

This embodiment assumes a configuration in which the source line is as narrow as less than about 2 $\mu$m to increase the aperture ratio of pixels, in which case it is difficult to take contact between the source region of a thin-film transistor and a source line.

Although this embodiment describes the manufacturing process of a single thin-film transistor, it is an ordinary configuration that more than several hundred thousand thin-film transistors are arranged in matrix.

The manufacturing process will be hereinafter described. First, a silicon oxide film or a silicon oxynitride film 102 as an undercoat film is formed on a glass or quartz substrate 101 at a thickness of 3,000 to 5,000 Å.

To form a silicon oxide film, plasma CVD is performed by using material gases of silane and oxygen, or by plasma CVD with a TEOS material gas.

To form a silicon oxynitride film, plasma CVD is performed in which the material gases are a combination of silane, oxygen, and ammonia, a combination of TEOS and ammonia, a combination of silane, oxygen, and $N_2O$, or a combination of TEOS and $N_2O$.

The undercoat film 102 has an effect of stabilizing the electrical characteristics of an active layer to be later formed thereon as well as a function of preventing such impurities as alkali ions from being introduced from the glass substrate 101 into the active layer. To attain these objects, it is preferred to use a silicon oxynitride film.

After the formation of the undercoat film 102, an amorphous silicon film (not shown) as a starting film to form an active layer is formed by plasma CVD or low-pressure thermal CVD. From the viewpoints of film quality and electrical characteristics, it is preferred that the amorphous silicon film be formed by low-pressure thermal CVD.

The amorphous silicon film (not shown) is then crystallized into a crystalline silicon film (not shown) by heating, laser light illumination, a combination thereof, or a combination of infrared light or ultraviolet light illumination and one of the above methods.

An island-like semiconductor layer 103 to later constitute the active layer of the thin-film transistor is formed by patterning the crystalline silicon film (not shown).

Thereafter, a 1,000-Å-thick, silicon oxide or silicon oxynitride film 104, which is to serve as a gate insulating film, is so formed as to cover the island-like semiconductor layer 103 in the same manner as the undercoat film 102 was formed above.

Also in this case, from the viewpoints of film quality and electrical characteristics, it is preferred that a silicon oxynitride film be formed as the gate insulating film 104.

Next, a 4,000-Å-thick aluminum film (not shown) to constitute a gate electrode is formed by sputtering. Scandium is mixed into the aluminum film at 0.1 wt % to prevent hillocks and whiskers from occurring due to abnormal growth of aluminum in a later heating step or laser light illumination step. Hillocks and whiskers, which are generated by a phenomenon that aluminum grows to assume a needle or prickle-like shape, may cause a problem of short-circuiting between wiring lines.

The aluminum film (not shown) is then patterned into aluminum patterns 105 to 107. The pattern 106 is to later constitute a gate electrode. The pattern 105/107 will be used to take contact to a source region.

The pattern 105/107 will not serve as an electrode, but will be used to provide a margin for the pattern registration error in forming a contact hole. FIG. 1A shows cross-sections of the pattern 105/107 having a rectangular or circular shape. Thus, the state of FIG. 1A is obtained.

Then, anodic oxidation is performed by using the pattern of the aluminum patterns 105 to 107 as the anode, whereby anodic oxide films are formed thereon. An electrolyte is obtained by neutralizing an ethylene glycol solution containing tartaric acid at 3% with aqueous ammonia. Platinum is used as the cathode in the electrolyte.

The temperature of the electrolyte is set at 10° C. The application voltage is increased up to 40 V. The thickness of the anodic oxide films is set at 600 ÅA.

The anodic oxide films serve as electrically insulative films covering the surfaces of the respective aluminum patterns, as well as have a function of suppressing occurrence of hillocks and whiskers as mentioned above.

Figure 1B:
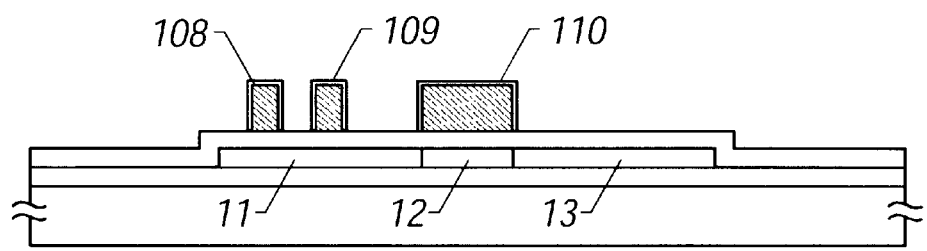
Figure 1C:
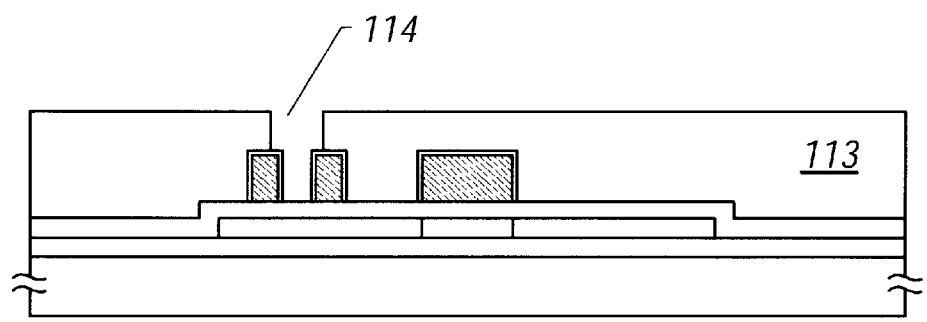

Anodic oxide films 108 to 110 are formed by the above step. Thus, the state of FIG. 1B is obtained.

In this state, impurity ions are implanted to form source and drain regions. In this embodiment, to form an n-channel thin-film transistor, P (phosphorus) ions are implanted by plasma doping. As a result, a source region 11, a channel region 12, and a drain region 13 are formed in a self-aligned manner.

Where the anodic oxide film 110 is thick (more than 1,000 Å), offset regions corresponding to such a thickness are formed in the active layer. This technique is disclosed in Japanese Unexamined Patent Publication Nos. Hei. 4-360580 and Hei. 5-166837.

Subsequently, a silicon oxide film, a silicon nitride film, or a silicon oxynitride film is formed as an interlayer insulating film 113 by plasma CVD.

Figure 2A:
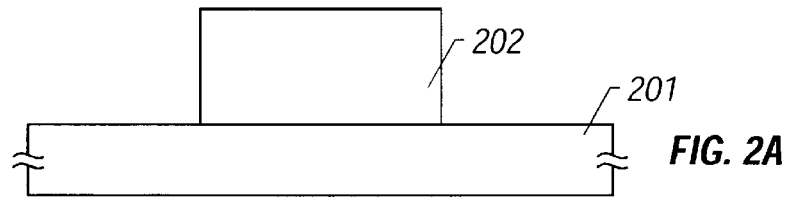
FIGS. 2A to 2E show a conventional thin-film transistor manufacturing process.
Figure 2B:
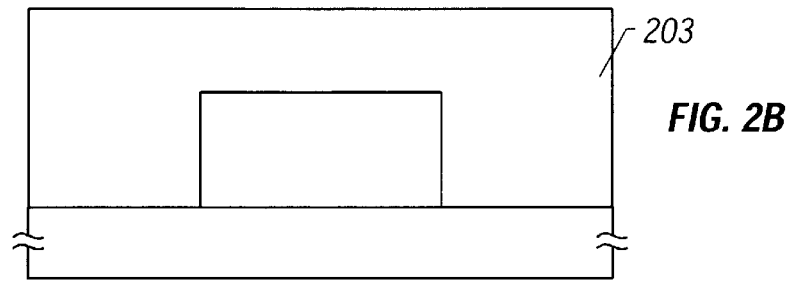
Figure 2C:
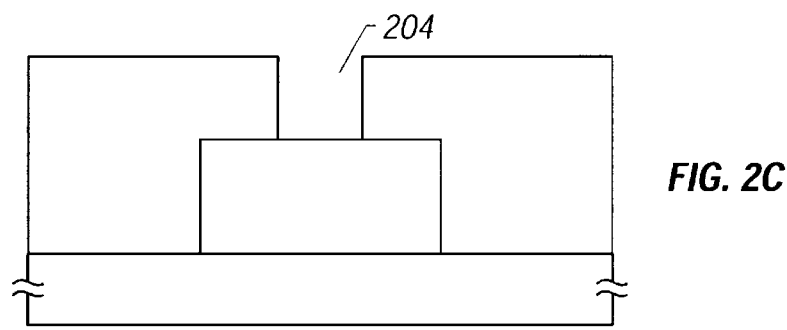
Figure 2D:
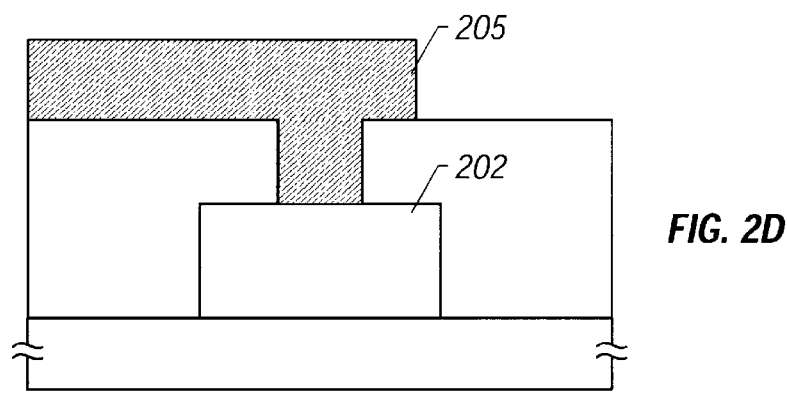
Figure 2E:
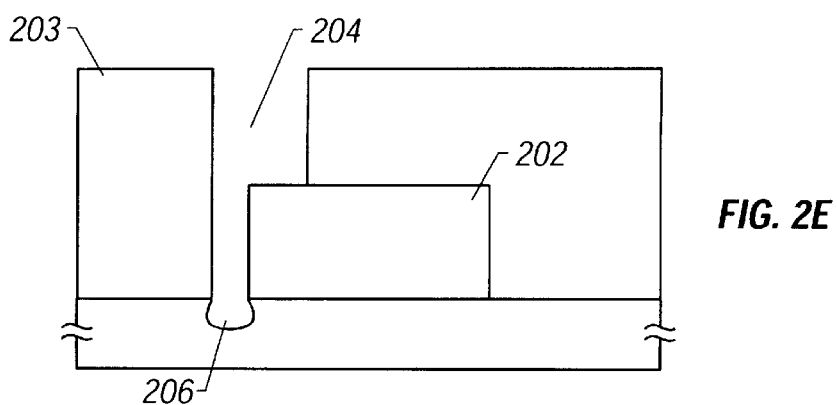

A contact hole 114 is formed through the insulating film 113 and subsequent a source line 115 is formed. Even if a certain registration error occurs in forming the contact hole 114 for the source region 11, the existence of the aluminum pattern 105/107 on which the anodic oxide film 108/109 is formed prevents the occurrence of a state as shown in FIG. 2E. This is because the width of the pattern 105/107 provides an additional margin in forming the contact hole 114.

Figure 1D:
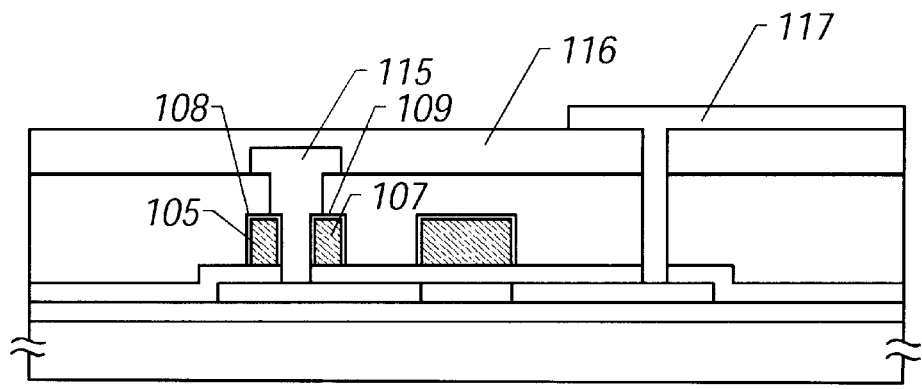

In the configuration shown in FIG. 1D, the source line 115 to contact the source region 11 of the thin-film transistor is so disposed that the source region 11 exists right under it. That is, the source line 115 overlaps with the active layer (source region 11) of the thin-film transistor, and the source line 115 and the source region 11 are brought into contact with each other at the overlapping portion.

While this configuration is advantageous in being capable of increasing the aperture ratio, it is disadvantageous in that a registration error of the contact hole 114 likely occurs in a case where the source line 115 is narrow.

However, the above registration error problem can be solved by forming the pattern 105/107 covered with the anodic oxide film adjacent to the contact hole opening area as in this embodiment.

Naturally the problem of FIG. 2E arises if the pattern registration error exceeds the margin that is assured by the pattern 105/107.

After the formation of the contact hole 114 for the source region 11, the source line 115 is formed which is composed of a titanium film, an aluminum film, and a titanium film. This wiring line structure is effective in thinning down a wiring line because it can reduce the resistance.

After the formation of the source line 115, a second interlayer insulating film 116 is formed which is a silicon oxide film or a silicon nitride film. Alternatively, a resin material such as acrylic or polyimide may be used. The use of a resin material is very advantageous because its surface can be planarized.

After the formation of the second interlayer insulating film 116, a contact hole reaching the drain region 13 and an ITO pixel electrode 117 are formed. The formation of the contact hole need not be performed at high positioning accuracy.

Where the active layer of the thin-film transistor is miniaturized and the positioning accuracy of the contact hole for the drain region 13 is required to be increased, it is necessary to secure an increased margin by forming an aluminum pattern as in the case of the source region 11.

Thus, a thin-film transistor is completed as shown in FIG. 1D. In this thin-film transistor, by virtue of the existence of the aluminum pattern 105/107 which increases the positioning margin, the problem of FIG. 2E can be prevented from occurring in forming the contact hole for the source region 11.

As a result, it can be prevented that the yield and the reliability are reduced by contact failures.

Embodiment 2

This embodiment relates to a thin-film transistor which is configured differently than in the first embodiment, though it is also disposed in the pixel region of an active matrix liquid crystal display device.

Figure 3A:
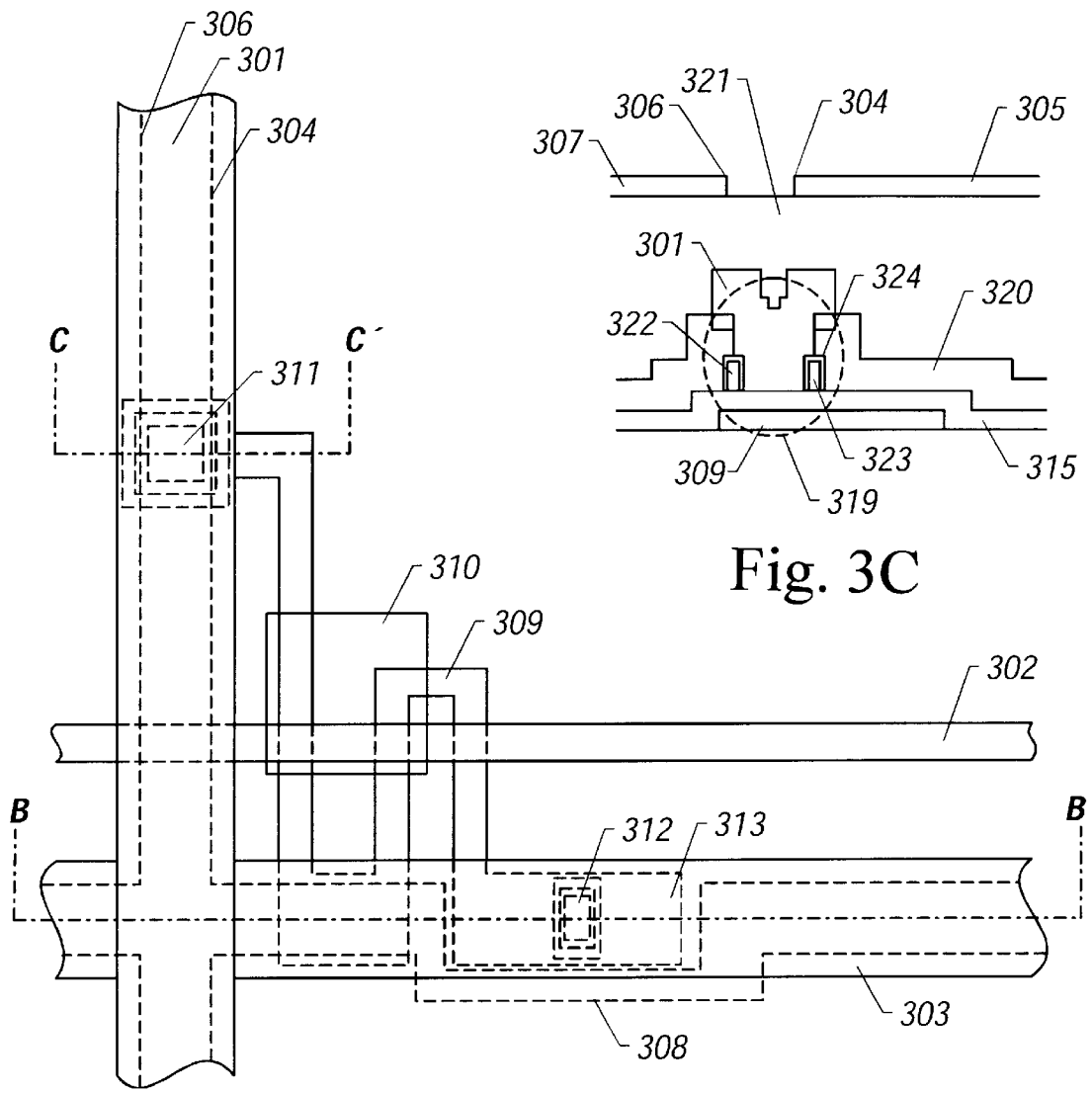
FIGS. 3A to 3C show a thin-film transistor manufacturing process according to a second embodiment of the invention.
Figure 3C:
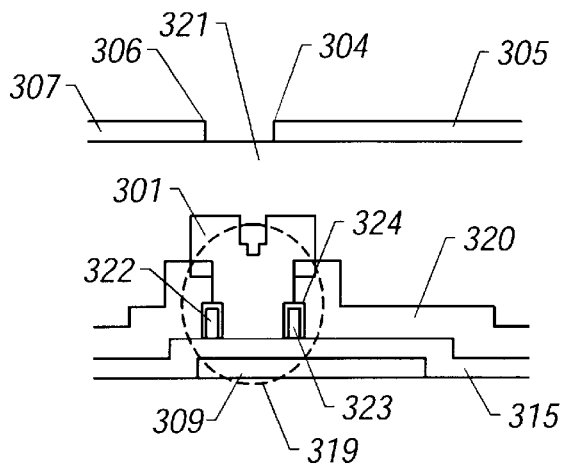
Figure 3B:
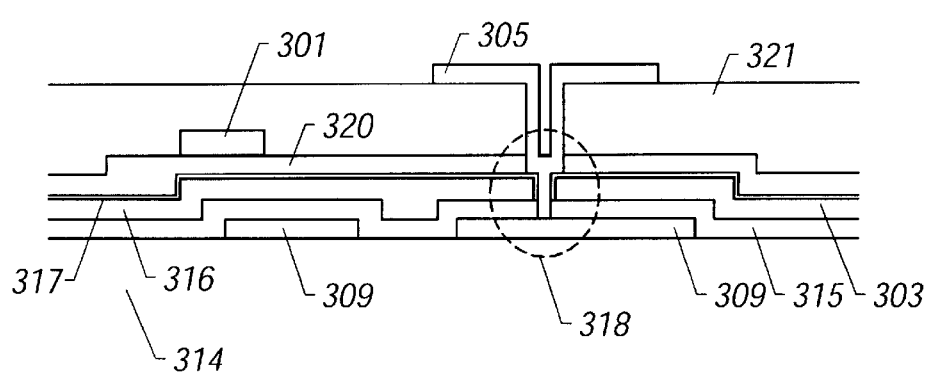

FIGS. 3A to 3C outlines a thin-film transistor according to this embodiment. FIG. 3A is a top view and FIGS. 3B and 3C are sectional views taken along lines B–B' and C–C' in FIG. 3A, respectively.

In FIGS. 3A to 3C, reference numerals 301 and 302 denote wiring lines called a source line and a gate line, respectively. The source lines 301 and the gate lines 302 are arranged in matrix and thin-film transistors are disposed at their intersections.

A capacitance line 303 is to provide an auxiliary, capacitance. Existing in the same plane as the gate line 302, the capacitance line 303 is formed at the same time as the gate line 302 is formed by patterning.

Reference numeral 304 denotes a peripheral portion or an ITO pixel electrode 305. In this embodiment, the peripheral portion 304 of the pixel electrode 305 overlaps with the source line 301 and the capacitance line 303.

This configuration eliminates the need of covering the peripheral portion of the pixel electrode with a black matrix, thereby providing a maximized aperture ratio.

Reference numeral 306 denotes a peripheral portion of an adjacent pixel electrode 307, and 308 denotes a peripheral portion of another adjacent pixel electrode.

An active layer 309 of a thin-film transistor is made of a crystalline silicon film. The thin-film transistor of this embodiment crosses the gate line at three locations, and therefore has three channel forming regions. This structure is equivalent to a series connection of three thin-film transistors.

MOS capacitors are formed at two regions where the active layer 309 crosses the capacitance line 303. Reference numeral 313 denotes a portion for increasing the capacitance.

Reference numerals 311 and 312 denote contact holes.

In FIG. 3B, reference numeral 314 denotes a glass or quartz substrate. From the viewpoint of heat resistance, it is preferred to use a quartz substrate. On the other hand, to decrease the cost or provide a large-area substrate, a glass substrate is preferred.

Although it is not apparent from FIGS. 3A to 3C, a silicon oxide film or a silicon oxynitride film as an undercoat film is formed on the substrate 314. The undercoat film has an effect of preventing impurities from diffusing from the substrate 314.

A gate insulating film 315 is made of a silicon oxide film. From the viewpoint of electrical stability, it is preferred to use a silicon oxynitride film rather than a silicon oxide film. A silicon oxynitride film can be formed by plasma CVD by using a mixed gas of oxygen, silane, and $N_2O$ or a mixed gas of TEOS and $N_2O$.

Reference numeral 316 denotes an aluminum film containing scandium at 0.18 wt %. A dense anodic oxide film 317 is formed on the aluminum film 316 by anodic oxidation, which is performed in an electrolyte with the aluminum film 316 used as the anode. The electrolyte is obtained by neutralizing an ethylene glycol solution containing tartaric acid at 3% with ammonia.

The dense anodic oxide film 317 is highly insulative, and is very hard to etch. This embodiment later uses the anodic oxide film 317 in forming contact portions 318 and 319, taking advantage of its high etching resistance.

Reference numeral 320 denotes an interlayer insulating film made of a silicon oxide film, a silicon nitride film, or a silicon oxynitride film. The source line 301 is formed on the interlayer insulating film 320. A second interlayer insulating film 321 made of a resin material is so formed as to cover the interlayer insulating film 320. Being made of a resin material, the surface of the second interlayer insulating film 321 can be planarized.

An ITO electrode 305 constituting a pixel electrode is formed on the second interlayer insulating film 321 made of a resin material. The ITO electrode 305 contacts the drain region of the active layer 309 at the portion 318.

In the contact portion 318, since the contact hole 312 is surrounded by the aluminum film 316 and the anodic oxide film 317 formed thereon, there occurs no such problem as overetching to the underlying member even if the contact hole 312 is formed at a position that is somewhat deviated from the intended position.

That is, since the dense anodic oxide film 317 that is highly resistant to various kinds of etching exists except where the contact hole 312 for the active layer 309 is to be formed, etching does not proceed past the anodic oxide film 317 even if the contact hole forming position is somewhat deviated; the underlying member can be prevented from being bored unlike the case of FIG. 2E (indicated by numeral 206).

This is very advantageous in the configuration of FIGS. 3A to 3C which makes full use of fine patterns, where a registration error in forming a contact hole would otherwise directly lead to a failure.

Also in the contact portion 319 of the source line 301 and the source region of the active layer 309 (see FIG. 3C), an aluminum film 322/323 covered with an anodic oxide film 324 is formed adjacent to the contact hole forming area.

In FIG. 3C, reference numerals 322 and 323 denote cross-sections of the aluminum film that is so formed as to surround the contact hole.

In the contact portion 319 shown in FIG. 3C, by virtue of the structure that the area where the contact hole 311 is to be formed is surrounded by the aluminum film 322/323 covered with the anodic oxide film 324, there can be prevented a failure as shown in FIG. 2E even at the occurrence of a registration error in forming the contact hole 311.

As described above, according to the configuration of FIGS. 3A to 3C, the contact hole for each of the source and drain regions of the thin-film transistor can be defined in a self-aligned manner by utilizing the aluminum film covered with the anodic oxide film. This prevents the occurrence of a failure as shown in FIG. 2E.

The configuration of this embodiment is a very effective technique in advancing the miniaturization.

Embodiment 3

In the embodiment of FIGS. 1A to 1D, the aluminum pattern (whose cross-sections are indicated by numerals 105 and 107 in FIG. 1D) has a circular shape, or a rectangular shape or some other proper polygonal shape. With such a shape, there is unavoidably formed, between the channel forming region and the contact area of the source region (or drain region), a high-resistivity region where no impurity ions are implanted.

Therefore, if it is intended to increase the width of the pattern 105/107 to obtain a larger process margin, the existence of the high-resistivity region adversely affects the characteristics of the thin-film transistor.

This embodiment is intended to solve the above problem, that is, to secure a sufficient process margin in forming a contact hole without adversely affecting the characteristics of a thin-film transistor.

Figure 4A:
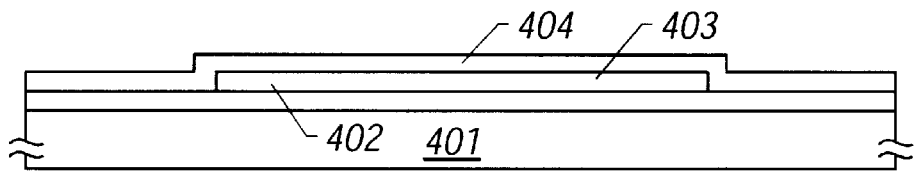
FIGS. 4A to 4E and FIGS. 5A to 5D show a thin-film transistor manufacturing process according to a third embodiment of the invention.

FIGS. 4A to 4E and 5A to 5D outline a manufacturing process according to this embodiment. First, as shown in FIG. 4A, a 3,000-Å-thick silicon oxide or silicon oxynitride film 402 as an undercoat film is formed on a glass substrate 401 by plasma CVD.

Further, an amorphous silicon film (not shown) is formed by plasma CVD or low-pressure thermal CVD, and then crystallized into a crystalline silicon film (not shown) by heating or laser light illumination.

The crystalline silicon film (not shown) is then patterned into an island-like region 403 which is to serve as the active layer of a thin-film transistor.

After the formation of the island-like region 403, a 1,000-Å-thick silicon oxide region 404 to serve as a gate insulating film is formed by plasma CVD so as to cover the island-like region 403. Thus, the state of FIG. 4A is obtained.

Subsequently, an aluminum film 405 to later constitute a gate electrode is formed. The aluminum film 405 will also be used in forming contact holes for source and drain regions.

It is noted that other materials capable of being anodized can be used instead of aluminum. In particular, where a high-temperature (more than 800° C.) process is employed with the use of a quartz substrate, it is preferred to use a material such as tantalum which is heat resistant and capable of being anodized.

Then, an anodic oxide film (not shown) as thin as 140 Å is formed on the surface of the aluminum film 405 by using, as an electrolyte, an ethylene glycol solution containing tartaric acid at 3%. In the electrolyte, the aluminum film 405 and platinum are used as the anode and the cathode, respectively.

The thickness of the resulting anodic oxide film can be made 140 Å by increasing the application voltage up to 10 V.

Figure 4B:
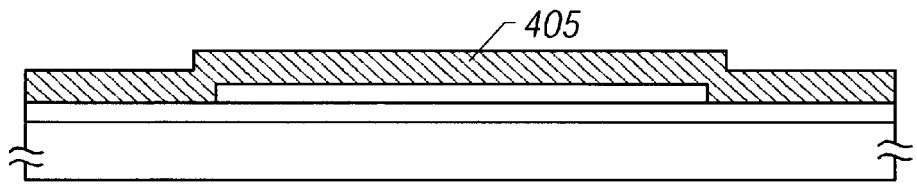

Being dense, the anodic oxide film (not shown) has a function of increasing the adhesiveness of a resist film that will be used in patterning the aluminum film 405. Thus, the state of FIG. 4B is obtained.

After resist masks 41 to 43 are formed, the aluminum film 405 is patterned to form regions 406 to 408. The region 407 will constitute a gate electrode while the regions 406 and 408 will secure process margins in forming contact holes for source and drain regions.

Figure 6A:
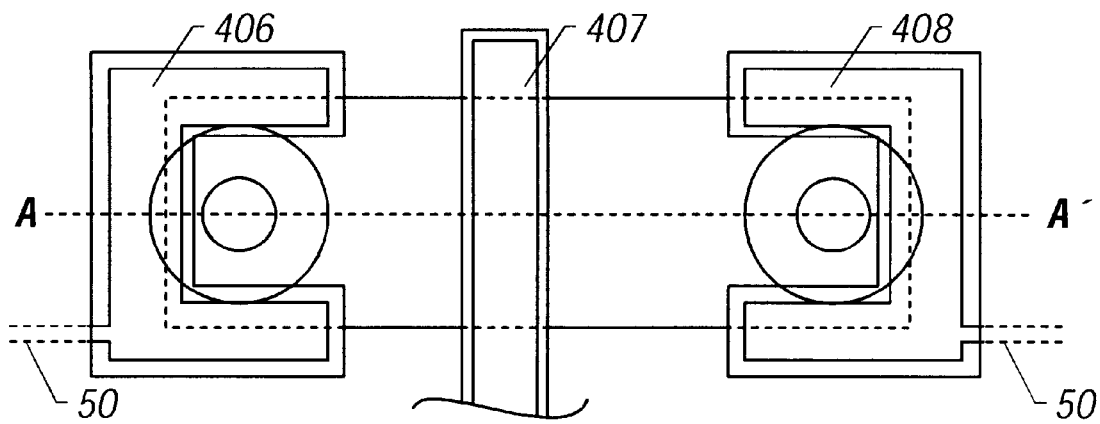
FIGS. 6A and 6B are top views of a thin-film transistor showing contact hole forming positions in the third embodiment.
Figure 6B:
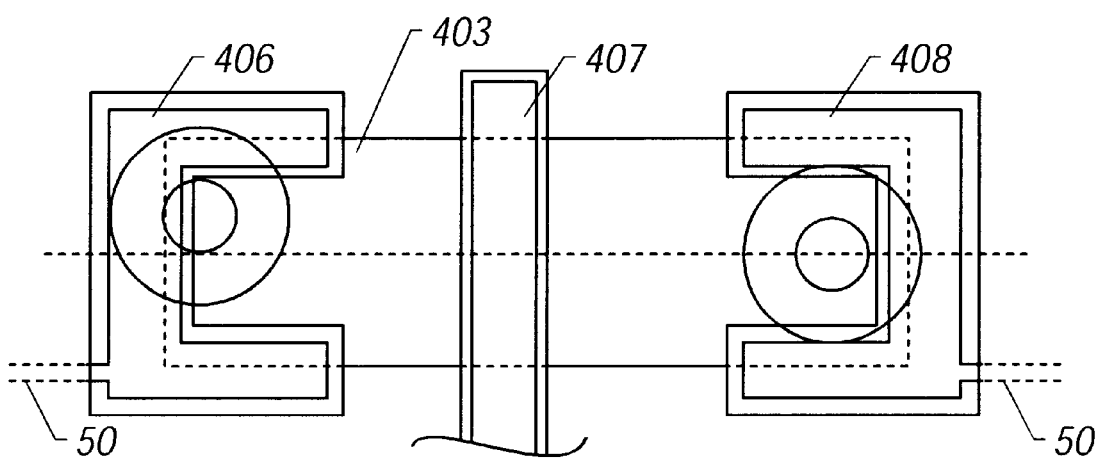

After the formation of the regions 406 to 408, porous anodic oxide films 409 to 411 are formed by using, as an electrolyte, a 3%-aqueous solution of oxalic acid. The porous anodic oxide films 409 and 411 are formed by anodic oxidation by applying voltages to the aluminum regions 406 and 408 through wirings 50 as shown in FIGS. 6(A) and 6(B).

The growth distance of the anodic oxide films 409 to 411 can be set up to several micrometers. It can be set at 6,000 Å by increasing the application voltage up to 8 V.

The porous anodic oxide film 410 is formed on the side face of the gate electrode 407, and will be used in forming low-concentration impurity regions (including a region usually called a LDD region).

In the above step of forming the porous anodic oxide films 409 to 411, the anodic oxidation proceeds only on the side faces of the patterns 406 to 408 because of the existence of the resist masks 41 to 43.

Figure 4C:
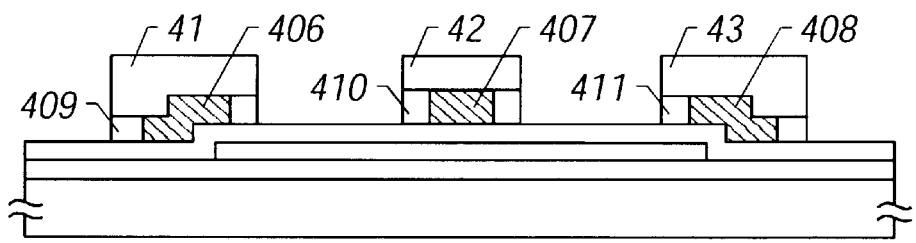

Once the state of FIG. 4C is obtained, the resist masks 41 to 43 are removed.

Figure 4D:
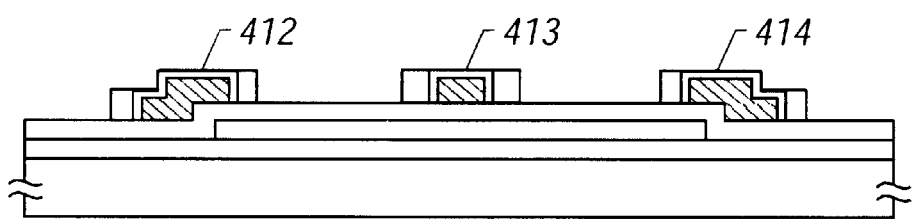
Figure 4E:
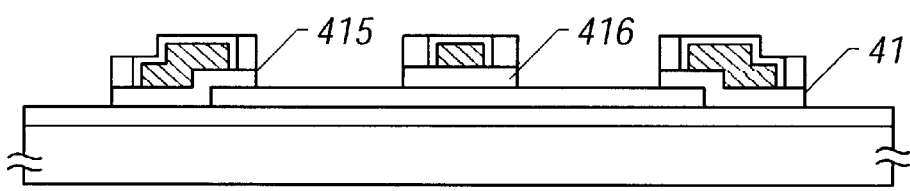

Next, anodic oxidation is again performed under the above-mentioned conditions for forming a dense anodic oxide film. In this step, anodic oxide films 412 to 414 are formed because an electrolyte enters into the inside of the porous anodic oxide films 409 to 411. Thus, the state of FIG. 4D is obtained. The dense anodic oxide films 412 and 414 are formed by anodic oxidation by applying voltages to the aluminum regions 406 and 408 through the wirings 50 as shown in FIGS. 6(A) and 6(B). Subsequently, the wirings 50 are removed from the aluminum regions 406 and 408.

Thereafter, the exposed portions of the silicon oxide film 404 are removed by etching to obtain residual silicon oxide films 415 to 417. The film 416 will serve as a gate insulating film.

Figure 5A:
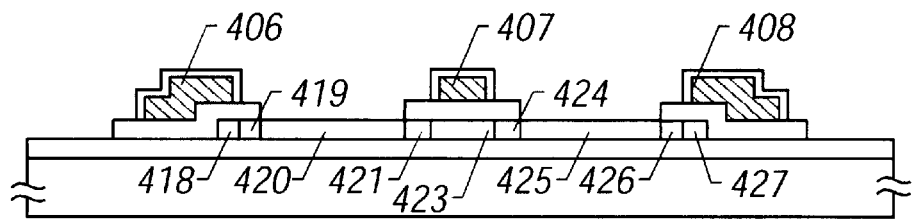

Next, as shown in FIG. 5A, the porous anodic oxide films 409 to 411 are removed selectively.

FIG. 6A is a top view showing this state. FIG. 5A is a sectional view taken along line A–A' in FIG. 6A.

As shown in FIG. 6A, each area (indicated by circles in FIG. 6A) where a contact hole for the active layer 403 is to be formed is surrounded, i.e., protected by the aluminum film on which the dense anodic oxide film is formed.

Subsequently, impurity ions are implanted. In this embodiment, to form an n-channel thin-film transistor, P ions are implanted by plasma doping.

In this step, no impurity ions are implanted into regions 418, 423, and 427 because the aluminum patterns 406 to 408 above the active layer 403 serve as masks. Among those regions, the region 423 becomes a channel forming region.

Since impurity ions are directly implanted into regions 420 and 425, they become high-concentration impurity regions, i.e., source and drain regions, respectively.

Impurity ions (P ions) are implanted at a lower concentration in regions 419, 421, 424, and 426 than in the regions 420 and 425 because of the residual silicon oxide films 415 to 417 existing above.

Among the low-concentration impurity regions 419, 421, 424, and 426, the regions 421 and 424 are adjacent to the channel forming region 423. In particular, the region 424 has a function of reducing the electric field strength between the channel forming region 423 and the drain region 425, thereby improving the off-current characteristic of the thin-film transistor.

The region 424 is generally called a LDD (lightly doped drain) region. Thus, the state of FIG. 5A is obtained.

After the implantation of impurity ions, laser light or strong light illumination is performed to anneal the regions where impurity ions have been implanted. Where a quartz substrate is used, the annealing may be performed by heating.

Figure 5B:
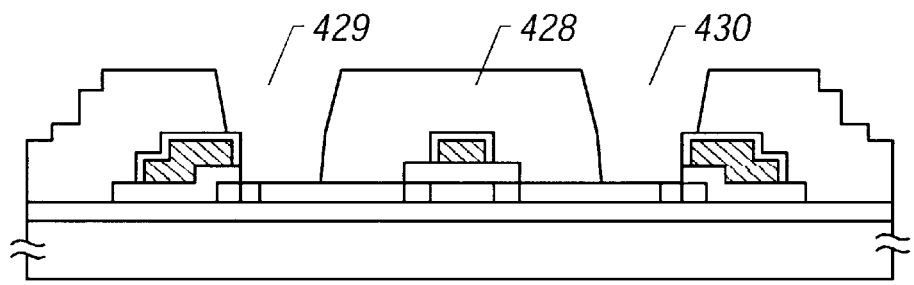

Next, as shown in FIG. 5B, a silicon oxide film, a silicon nitride film, or a silicon oxynitride film is formed as an interlayer insulating film 428.

Contact holes 429 and 430 are then formed. Even if the contact hole forming position is deviated from the intended position so that the contact hole encompasses an area not covered with the active layer 403, the underlying member can be prevented from being bored because the peripheral portion of the active layer 403 is protected by the aluminum film 406 or 408 as shown in FIG. 6B.

Once the state of FIG. 5B is obtained, impurity ions, i.e., P ions are implanted again. This is to prevent a contact failure from being caused by the existence of the low-concentration impurity regions 419 and 426 having a relatively high resistivity.

The regions where impurity ions have been implanted are activated by again performing laser light or strong light illumination. The resistivity of the contact regions of the active layer can be reduced in this manner.

Figure 5C:
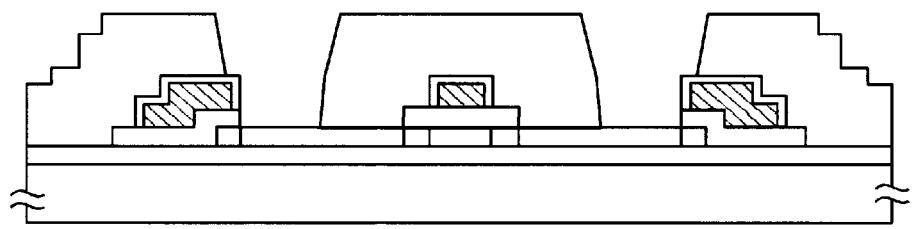
Figure 5D:
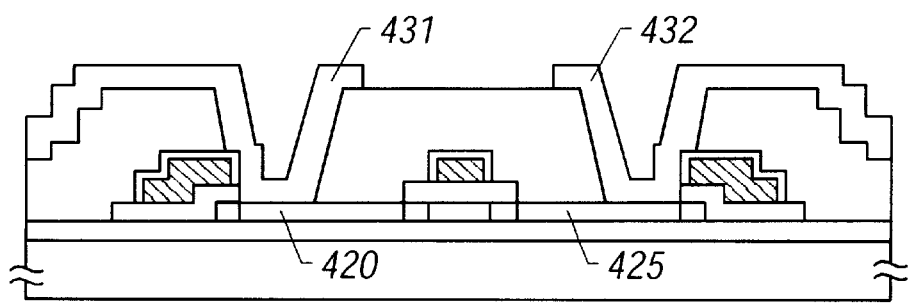

Thus, the state of FIG. 5C is obtained. Thereafter, contact wiring lines/electrodes 431 and 432 are formed as shown in FIG. 5D, to complete a thin-film transistor.

In this embodiment, by virtue of the existence of the aluminum patterns 406 and 408 covered with the anodic oxide films that are hard to etch, the process margin of the mask registration in forming the contact holes can be increased.

Embodiment 4

This embodiment corresponds to a case where a contact hole forming position is deviated in the thin-film transistor manufacturing process of the third embodiment.

Figure 6C:
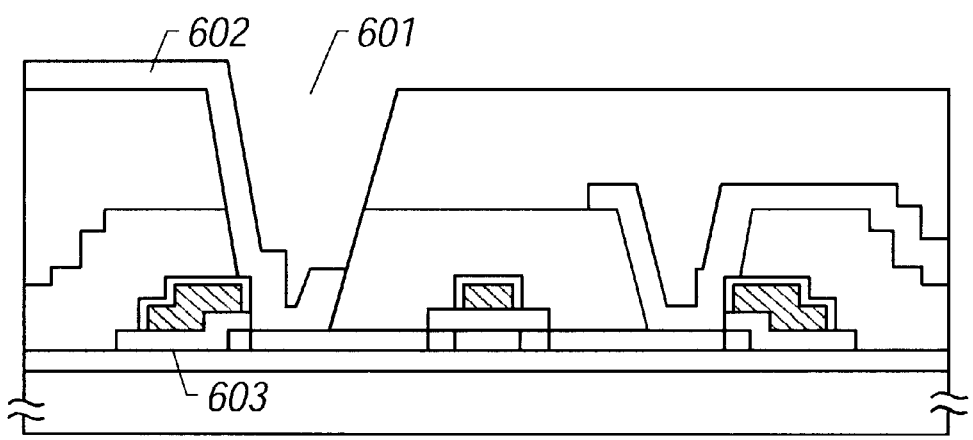
FIG. 6C shows a step of a thin-film transistor manufacturing process in which a contact hole is deviated from an intended position (fourth embodiment)

In FIG. 6C, reference numerals 601 to 603 denote a contact hole, an electrode, and an aluminum pattern, respectively. The contact hole 601 is deviated from the intended position. Even in this case, there can be prevented the problem that a portion of the underlying member adjacent to the active layer is bored.

Embodiment 5

This embodiment is directed to a manufacturing process of a thin-film transistor that is configured differently than in the third embodiment.

Figure 7A:
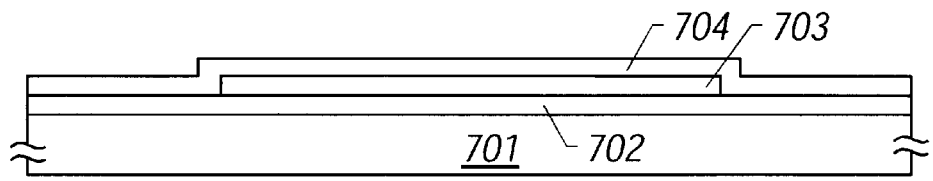
FIGS. 7A to 7E and FIGS. 8A to 8D show a thin-film transistor manufacturing process according to a fifth embodiment of the invention.

FIGS. 7A to 7E and 8A to 8D show a manufacturing process according to this embodiment. First, as shown in FIG. 7A, an undercoat film 702 is formed on a glass substrate 701 and a crystalline silicon film as an active layer 703 is formed thereon. Further, a silicon oxide film 704 to serve as a gate insulating film is formed.

Figure 7B:
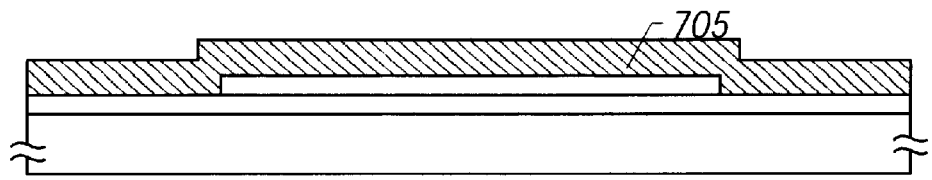

After an aluminum film 705 is formed as shown in FIG. 7B, a very thin anodic oxide film (not shown) is formed thereon.

Figure 7C:
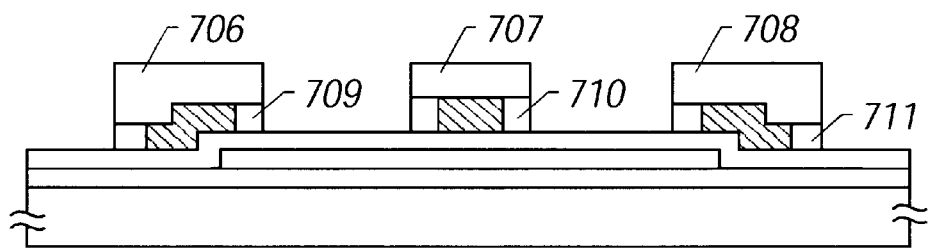

Next, as shown in FIG. 7C, the aluminum film 705 is patterned by using resist masks 706 to 708, and then porous anodic oxide films 709 to 711 are formed.

Figure 7D:
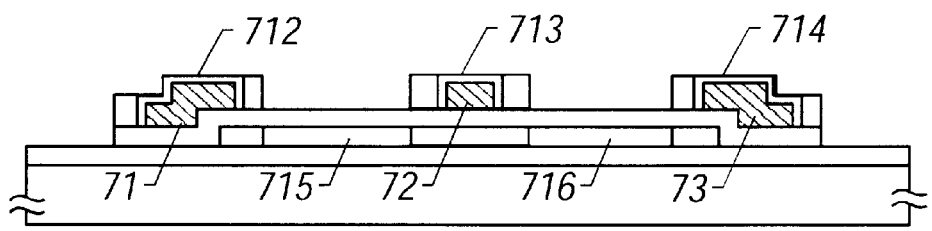

After the resist masks 706 to 708 are removed, dense anodic oxide films 712 to 714 are formed. Thus, the state of FIG. 7D is obtained.

In this manner, aluminum patterns 71 to 73 on which the porous anodic oxide films 709 to 711 are formed are obtained. The pattern 72 becomes a gate electrode.

Impurity ions are implanted in this state (the active layer 703 is lightly doped), to form low-concentration impurity regions 715 and 716 in a self-aligned manner.

After the porous anodic oxide films 709 to 711 are removed, impurity ions are implanted again to form a high-concentration impurity region 718 to serve as a source region, a region 719 to serve as a channel forming region, a high-concentration impurity region 721 to serve as a drain region, low-concentration impurity regions 717 and 722, and a low-concentration impurity region 720 to serve as a LDD region.

Figure 7E:
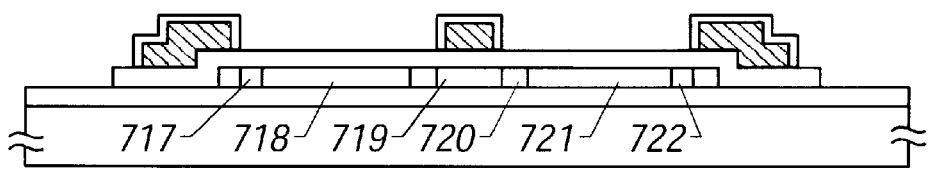
Figure 8A:
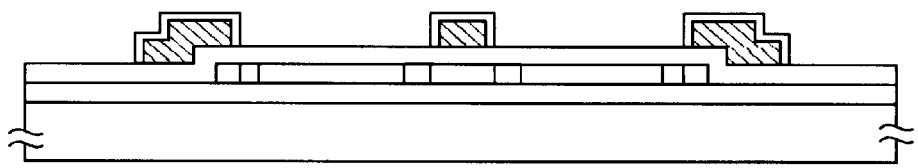

Subsequently, the regions where impurity ions have been implanted are activated by laser light or strong light illumination. Thus, the state of FIGS. 7E and 8A is obtained.

Figure 8B:
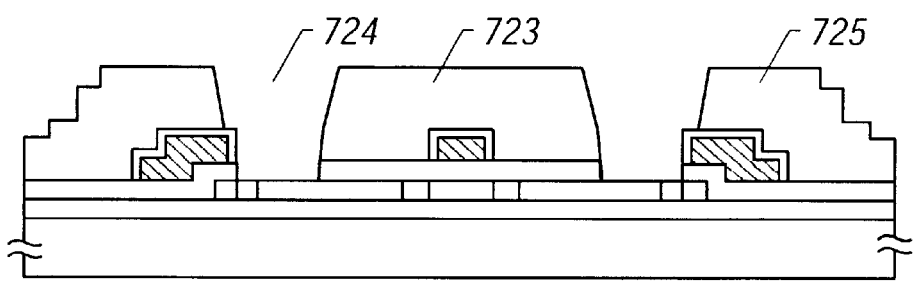

After an interlayer insulating film 723 is formed, contact holes 724 and 725 are formed. (FIG. 8B)

Figure 8C:
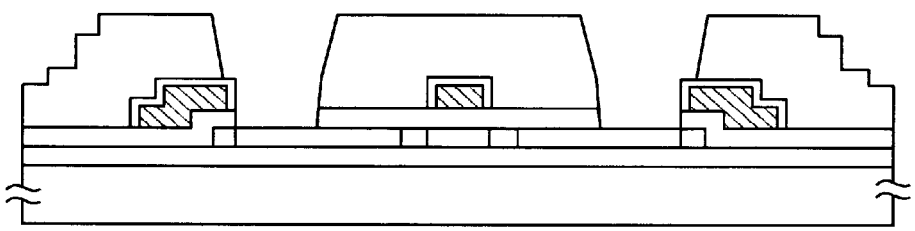
Figure 8D:
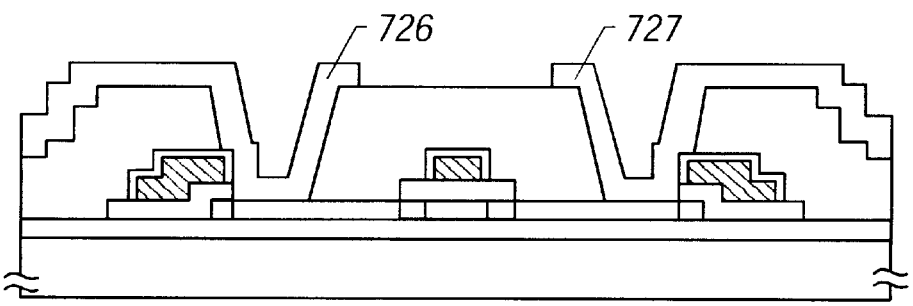

Then, impurity ions are again implanted to reduce the resistivity of the regions of the active layer which have been exposed by the contact holes 724 and 725. (FIG. 8C)

A source electrode 726 and a drain electrode 727 are then formed to complete a thin-film transistor.

Also in this embodiment, even if the contact holes 724 and 725 are deviated from their intended positions, the existence of the patterns 71 and 73 covered with the anodic oxide films prevents the problem of FIG. 2E.

The top views of FIGS. 6A and 6B similarly apply to this embodiment. The porous anodic oxide films 709 and 711 and the dense anodic oxide films 712 and 714 are formed by the respective anodic oxidation processes by applying voltages to the aluminum patterns 71 and 73 through the wirings 50. After the anodic oxidation processes, the wirings 50 are removed from the aluminum patterns 71 and 73.

Embodiment 6

Figure 9:
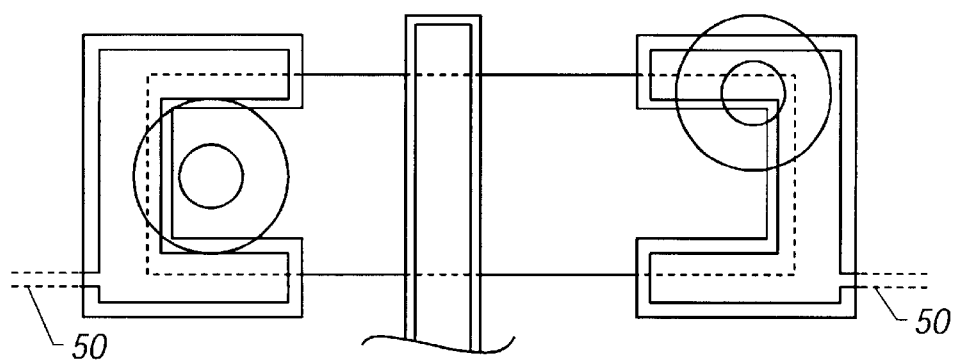
FIG. 9 is a top view of a thin-film transistor showing a deviated contact hole forming positions (sixth embodiment).

This embodiment relates to another example of a pattern registration error (see FIG. 9) that is different than shown in FIG. 6B. The wirings 50 as shown in FIG. 9 are used in anodic oxidation to form anodic oxide films on surfaces of aluminum patterns having a function of determining a position of a contact to a semiconductor, e.g. a source and a drain of a transistor.

According to the invention, even where a circuit pattern is miniaturized, it can be manufactured with a large process margin, which in turn reduces the manufacturing cost, increases the production yield, and improves the reliability.

What is claimed is:

1. A semiconductor device comprising:

a semiconductor formed on a substrate;

an insulating film formed on the semiconductor;

a gate electrode formed on the insulating film;

a plurality of patterns formed on the insulating film over the same semiconductor that supports the rate electrode and comprising a material capable of being anodized, wherein at least one pattern is located over an edge of the semiconductor and is displaced and insulated from the gate electrode so as to determine and confine a position of a contact hole to the semiconductor between the gate electrode and said at least one pattern without exposing the substrate; and anodic oxide films formed on respective surfaces of the plurality of patterns.

2. A semiconductor device comprising:

a semiconductor formed over a substrate;

an insulating film formed on the semiconductor;

a plurality of patterns formed on the insulating film over the same semiconductor that supports a gate electrode and comprising a material capable of being anodized, at least one pattern serving as the gate electrode, and at least one other pattern located partially over an edge of the semiconductor and partially over a portion of the substrate adjacent to the semiconductor, wherein the at least one other pattern is displaced and isolated from said gate electrode to confine a position of a contact between the at least one other pattern and said gate electrode over the semiconductor; and anodic oxide films formed on respective surfaces of the plurality of patterns.

3. The device of claim 2, wherein the semiconductor is a thin-film semiconductor formed on an insulative surface of the substrate.

4. The device of claim 2, further comprising source and drain regions in the semiconductor located relative to the gate electrode to form a thin-film transistor, and wherein the contact between the at least one other pattern and said gate electrode is in contact with one of the source and drain regions.

5. A semiconductor device comprising:

a semiconductor film;

an insulating film formed on said semiconductor film;

a pair of patterns and a gate electrode formed on said insulating film, wherein each of said pair of patterns and said gate electrode is covered with an anodic oxide film and said pair of patterns have a function of determining a position of a contact to said semiconductor film;

a first interlayer insulating film formed on said pair of patterns and said gate electrode, wherein said first interlayer insulating film and said insulating film define a contact hole therethrough between said pair patterns;

a source line formed on said first interlayer insulating film and in contact with said semiconductor film through said contact hole; and a second interlayer insulating film formed on said first interlayer insulating film and said source line.

6. The device of claim 5, wherein said contact hole has a first portion in said first interlayer insulating film and a second portion between said pair of patterns and in said insulating film, said first portion configured to be larger than said second portion.

7. A semiconductor device comprising:

a semiconductor film;

an insulating film formed on said semiconductor film;

a pair of patterns formed on said insulating film for determining a position of a contact to said semiconductor film, each of said pair of patterns covered with an anodic oxide film;

a first interlayer insulating film formed on said pair of patterns;

a second interlayer insulating film formed on said first interlayer insulating film, wherein said insulating film and said first and second interlayer insulating films define a contact hole therethrough that is located between said pair of patterns to expose a portion of said semiconductor film; and a pixel electrode formed on said second interlayer insulating film and located to contact said exposed portion of said semiconductor film through said contact hole.

8. The device of claim 7 wherein said contact hole has a first portion in said first and second interlayer insulating films and a second portion between said pair of patterns and in said insulating film, said first portion configured to be larger than said second portion.

* * * * *